(12) United States Patent
Weiss et al.

(10) Patent No.: US 8,818,747 B2
(45) Date of Patent: Aug. 26, 2014

(54) CALIBRATION OF A TRIAXIAL MAGNETIC FIELD SENSOR

(75) Inventors: Stefan Weiss, Tuebingen (DE); Julian Bartholomeyczik, Reutlingen (DE); Sergej Scheiermann, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 649 days.

(21) Appl. No.: 13/101,844

(22) Filed: May 5, 2011

(65) Prior Publication Data

US 2011/0301897 A1  Dec. 8, 2011

(30) Foreign Application Priority Data

Jun. 2, 2010 (DE) .......................... 10 2010 029 668

(51) Int. Cl.
*G01D 18/00* (2006.01)
*G01P 21/00* (2006.01)
*G01R 35/00* (2006.01)
*G01C 25/00* (2006.01)

(52) U.S. Cl.
USPC .......................................... 702/85; 702/104

(58) Field of Classification Search
USPC .................................................. 702/85, 104
See application file for complete search history.

(56) References Cited

U.S. PATENT DOCUMENTS

| 7,275,008 | B2 | 9/2007 | Plyvänäinen | |
| 7,930,148 | B1* | 4/2011 | Figaro et al. | 702/196 |
| 2010/0121599 | A1* | 5/2010 | Boeve et al. | 702/93 |
| 2011/0106477 | A1* | 5/2011 | Brunner | 702/104 |

* cited by examiner

*Primary Examiner* — Janet Suglo
(74) *Attorney, Agent, or Firm* — Kenyon & Kenyon LLP

(57) ABSTRACT

A method for calibrating a triaxial magnetic field sensor includes steps for determining an offset of recorded measured values of the magnetic field sensor using a superposed signal and for determining the sensitivity of the magnetic field sensor along the first measuring axes. The determination of the sensitivity includes steps for determining the sensitivity of the magnetic field sensor along a first measuring axis and for determining the sensitivity of the magnetic field sensor along the other measuring axes based on the sensitivity of the first measuring axis and the determined offset.

15 Claims, 3 Drawing Sheets

CALIBRATION OF A TRIAXIAL MAGNETIC FIELD SENSOR

BACKGROUND INFORMATION

Magnetic field sensors which determine a magnetic field with respect to a plurality of measuring axes must normally be calibrated using a complex measurement technique during manufacturing. The calibrating procedure may be very complex and costly. In particular when the magnetic field sensor is very precise, for example when it is intended to measure and record the earth's magnetic field, a complex calibrating procedure using a complex measurement technique is required.

Apart from manufacturing tolerances, instances of interference of such a magnetic field sensor may also be a function of an environment of the sensor at the point of use, so that the calibration during manufacture is not adequate. For example, soft magnetic and/or magnetized objects or current-carrying conductors passing close to the magnetic field sensor may falsify the determined magnetic field. When the magnetic field sensor is used, for example, in a mobile telephone or a portable computer, such interference is practically unavoidable.

U.S. Pat. No. 7,275,008 describes a method for compensating measurement errors of three-dimensional magnetic field measured values, a geometric body having a number of recorded measured values lying on its surface being determined. Parameters which define a deviation of the shape of this body from the geometric reference figure of a sphere are determined. The parameters are used for plotting recorded measured values on calibrated measured values.

An object of the present invention is to provide a calibration method for a three dimensional magnetic field sensor requiring low computational complexity, so that it may be used as efficiently as possible in a mobile device.

SUMMARY OF THE INVENTION

According to the present invention, a method for calibrating a triaxial magnetic field sensor includes steps for determining an offset of recorded measured values of the magnetic field sensor using a superposed signal, for determining the sensitivity of the magnetic field sensor along a first measuring axis and for determining the sensitivity of the magnetic field sensor along the other measuring axes based on the sensitivity of the first measuring axis and the determined offset.

The method according to the present invention is able to achieve exact results while exhibiting good reproducibility. Moreover, the method may be used in a mobile system having limited computational power and energy. Furthermore, the method according to the present invention may be independent of sensor characteristics such as different sensitivities or an offset with regard to the measuring axes of the magnetic field sensor.

Preferably, the sensitivity of the first measuring axis is determined by application of a known magnetic field to the magnetic field sensor. As a result, the method may be used independently of a size and direction of the earth's magnetic field. The magnetic field may be oriented along the first measuring axis so that a device for generating the magnetic field may be implemented cost-effectively and relatively simply as a printed circuit on a circuit board or as a microstructure in a microelectromagnetic system (MEMS). This makes it possible to avoid a device requiring complex manufacturing methods acting in a known manner on several of the measuring axes for generating the magnetic field.

The sensitivity along the other measuring axes may be determined using a numerical method, for example, a Newton iteration method. This keeps the computational complexity for the method within limits so that the method may be used on a processing unit of a mobile device. Also known are numerous variants of the Newton iteration method, which may be adapted easily to the problem and used, for example in a programmable data processing system. In other specific embodiments, another known method may also be used, for example, a Kalman filter or a method of least squares.

The method may also include storage of recorded measured values which maintain a predetermined minimum distance from all previously stored measured values. The determination of the offset and the determination of the sensitivity may then be performed on a number of measured values which have an advantageous geometric constellation, making it possible to achieve good results based on relatively few measured values using reduced computational complexity.

After a first pass, the method may be continued using additional recorded measured values in order to continually improve the calibration. It is thus advantageously possible for a calibration to be provided during ongoing operation (in-use calibration), the quality of which may be continuously improved using an increasing number of stored measured values.

In another specific embodiment, at least one process parameter may be adjusted based on a result of the method. This makes it possible to improve the precision of the method in a repeated pass and/or reduce a processing or storage expense for the method.

The method may also include a correction of recorded measured values corresponding to the determined sensitivities and the determined offset. It is thus possible to provide an integrated magnetic field sensor which performs a correction independently and provides calibrated and compensated measured values.

The method may also be implemented as a computer program product having program code means on a processing unit or stored on a computer-readable data carrier.

According to another aspect, the present invention includes a device for calibrating a triaxial magnetic field sensor, which includes a unit for determining an offset of the measured values of the magnetic field sensor by a superposed signal, a unit for determining the sensitivity of the magnetic field sensor along a first measuring axis and a unit for determining the sensitivity of the magnetic field sensor along the other two measuring axes based on the sensitivity of the first measuring axis and the determined offset.

In a preferred specific embodiment, the device also includes a unit for applying a known magnetic field to the magnetic field sensor along the first measuring axis.

DETAILED DESCRIPTION

Figure 1:
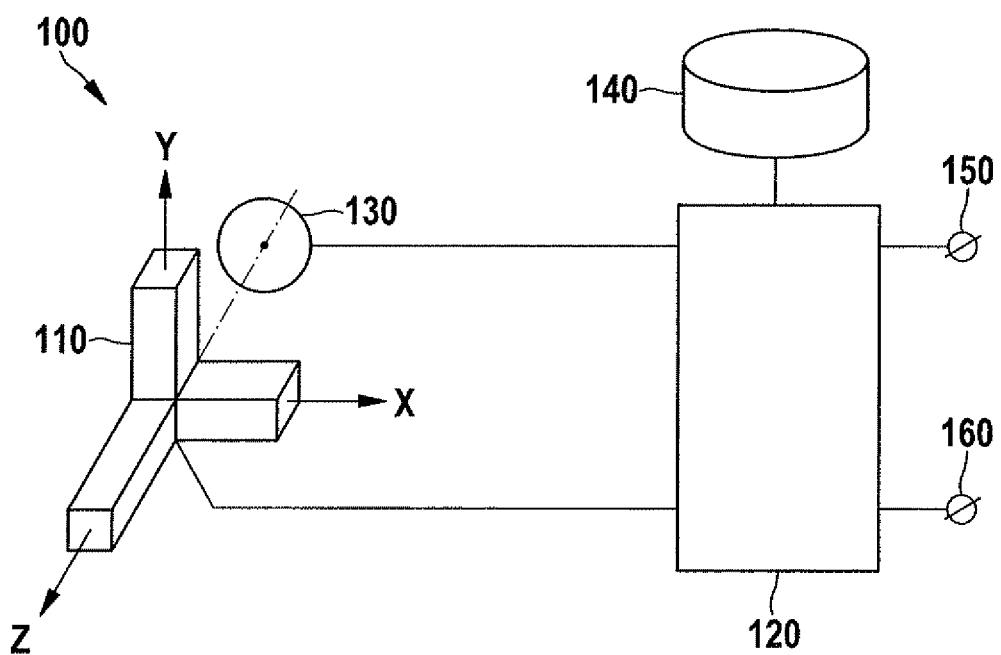
FIG. 1 shows a measuring system for the triaxial determination of a magnetic field.

FIG. 1 shows a measuring system 100 for the determination of a multiaxial magnetic field. Measuring system 100 includes a triaxial magnetic field sensor 110, a processing unit 120, a coil 130, a memory 140, a first interface 150 and a second interface 160.

Triaxial magnetic field sensor 110 determines a magnetic field along three axes x, y and z standing perpendicularly to one another in pairs. Measured values of the magnetic field determined using magnetic field sensor 110 are provided to processing unit 120. In this connection, a measured value provided by analog means may be digitized. Processing unit 120 is set up to filter the measured values provided by magnetic field sensor 110 by selecting measured values that satisfy predetermined criteria and for storing filtered measured values in memory 140 for subsequent processing. Furthermore, processing unit 120 is connected to coil 130 in order to generate a known magnetic field along the z measuring axis, if needed.

Based on the stored measured values, processing unit 120 later determines calibration parameters, based on which a correction of a recorded measured value of magnetic field sensor 110 is possible. These calibration parameters include a compensation of an offset of the measured values along the x, y and z measuring axes and an adjustment of the sensitivities of magnetic field sensor 110 with regard to these axes.

Processing unit 120 provides the determined calibration parameters via first interface 150. Furthermore, processing unit 120 provides corrected measured values of magnetic field sensor 110 via second interface 160. Both interfaces 150 and 160 may be physical (in the form of hardware) and/or virtual (in the form of software).

Figure 2:
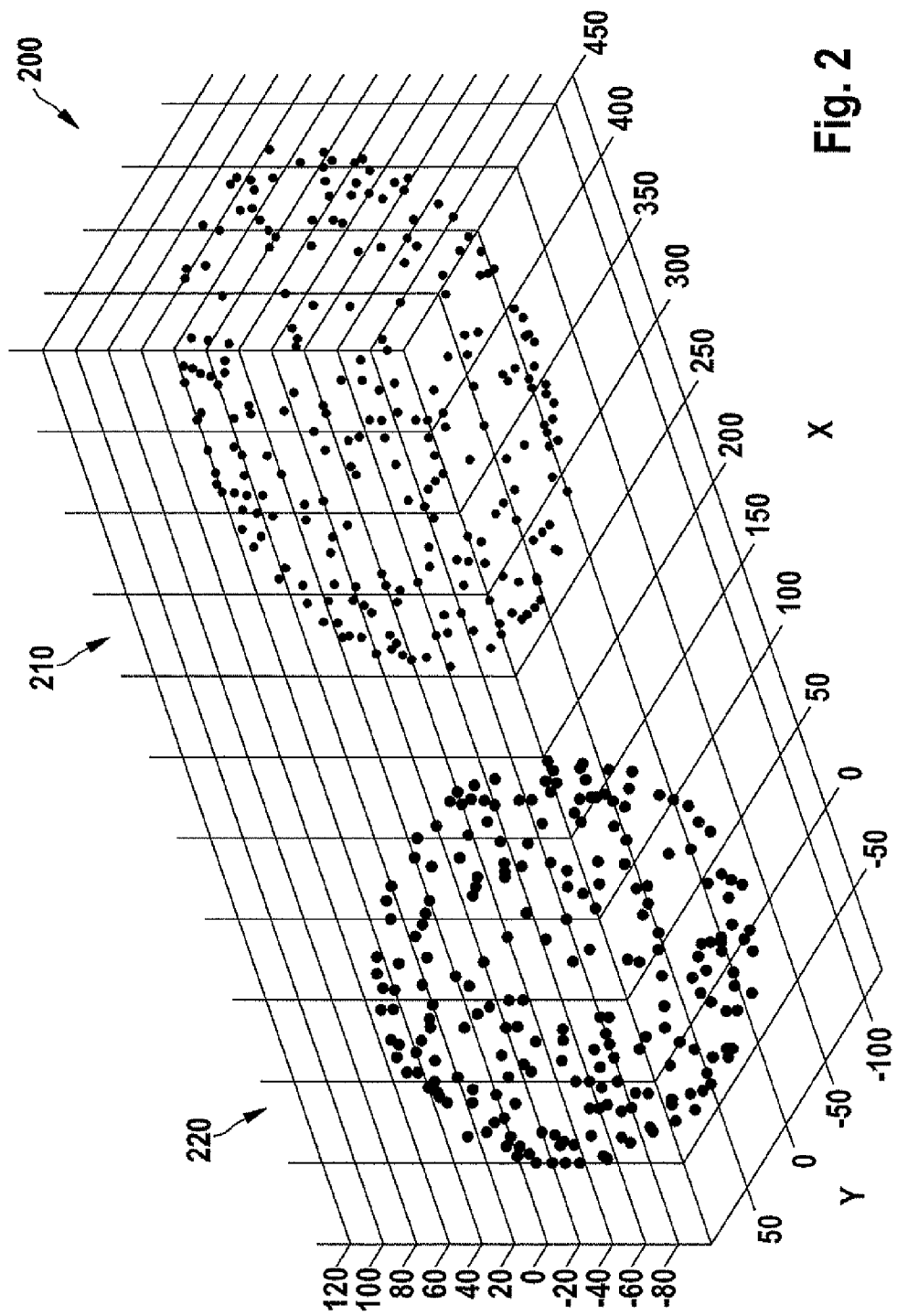
FIG. 2 shows a representation of unprocessed and processed measured values of the measuring system according to FIG. 1.

FIG. 2 shows a diagram 200 having uncorrected measured values 210 and corrected measured values 220. When determining the earth's magnetic field, the amount of the magnetic field is ideally known relatively precisely, so that the recorded measured values primarily provide directional information. If the measuring axes are perpendicular to one another in pairs, the recorded measured values may be entered into a Cartesian coordinate system corresponding to the measuring axes and lie there on the surface of a sphere around the origin of the measuring axes. This ideal situation applies to processed measured values 220 in FIG. 2.

In a real measuring system such as measuring system 100 from FIG. 1, different sensitivities of magnetic field sensor 110 normally exist along the measuring axes. Furthermore, the determined magnetic field is offset by an amount along one of the measuring axes. Uncorrected measured values 210 in FIG. 2 represent such real measured values.

An object of the present invention is to determine both the offset of measured values 210 in relation to measured values 220 as well as the distortion of measured values 210 along the measuring axes with regard to measured values 220. This determination is referred to as calibration; the determined calibration parameters may be used to convert any real measured value 210 into the corresponding ideal measured value 220. This process is referred to as correction.

Figure 3:
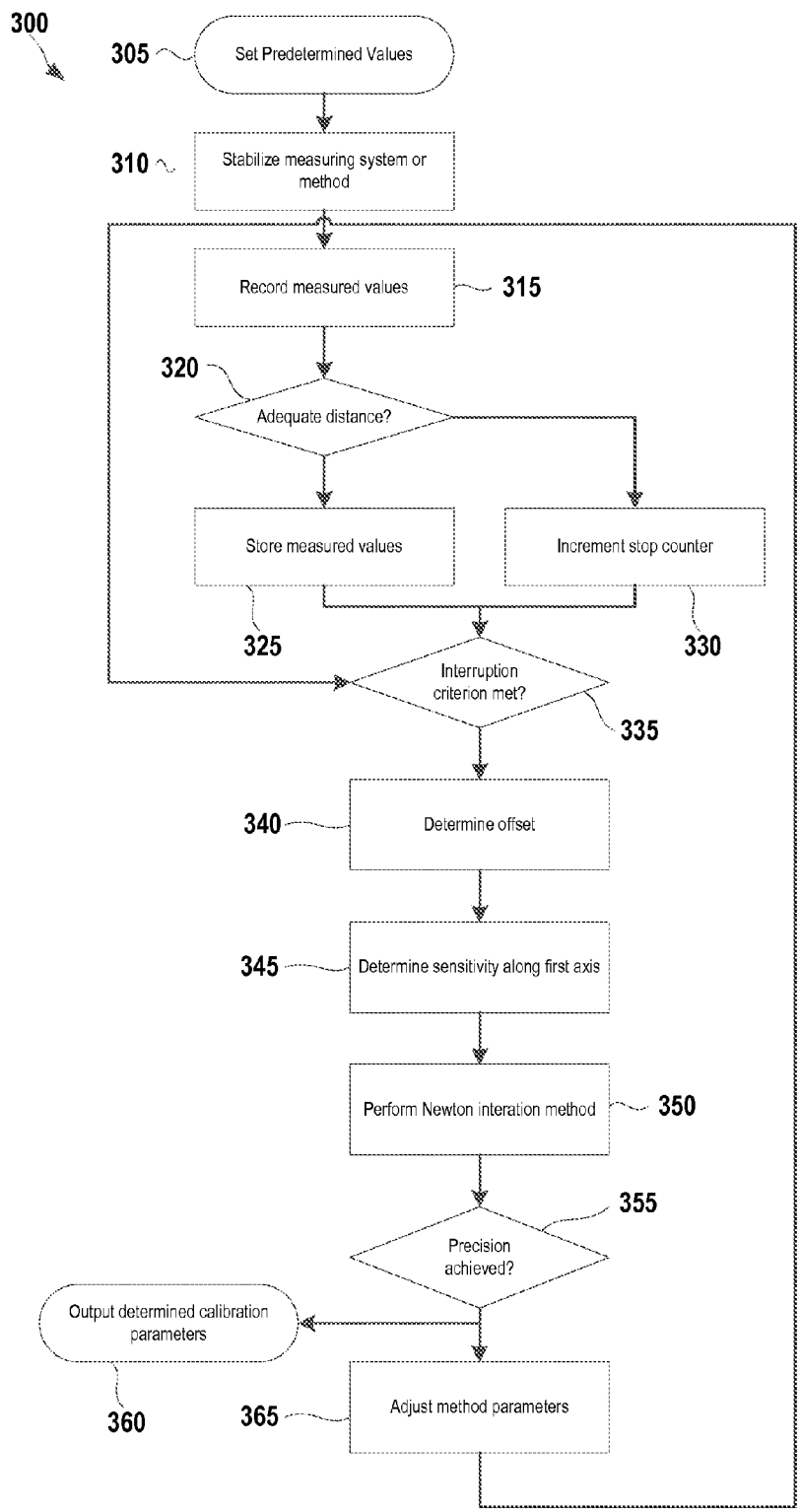
FIG. 3 shows a method for calibrating the magnetic field sensor from FIG. 1.

FIG. 3 shows a flow chart of a method 300 for calibrating triaxial magnetic field sensor 110 from measuring system 100 from FIG. 1.

In a first step 305, parameters of method 300 are set to predetermined standard values. These parameters include a number of measured values to be expected, an expected field strength of the magnetic field to be determined, an expected radius of the sphere corresponding to measured values 220 in FIG. 2 and parameters for defining groups to which the recorded measured values may be assigned.

After initialization, a predetermined number of measured values is ignored in step 310 to allow measuring system 100 or method 300 to be stabilized. These measured values are recorded and processed as described in the following; however, the measured values are not output.

After that, measured values of magnetic field sensor 110 are recorded in a step 315. In a step 320, a check is performed for a recorded measured value to determine whether the measured value maintains an adequate distance from all previously stored measured values in the Cartesian coordinate system represented in FIG. 2. This distance may, for example, be stated in the form of a predetermined Euclidean distance.

In one specific embodiment, a number of clusters may be defined as a rasterization along the measuring axes so that the recorded measured value may be assigned to one of the clusters. In doing so, a check is performed to determine whether a predetermined number of measured values has already been assigned to this cluster. In this case, the measured value is discarded; otherwise it is assigned to the cluster. The formation of clusters ensures that measured values assigned to different clusters exhibit a minimum distance of half a cluster size on average.

If the distance of the recorded measured value in step 320 has been found to be of adequate size, the measured value is stored in memory 140 in step 325. Otherwise, a stop counter is incremented in a step 330, the stop counter counting the number of successively discarded measured values. When storing, this counter is reset to zero in step 325.

In a step 335, a check is performed to determine whether an interruption criterion for the filtering and storage of measured values was met in steps 315 to 335. The first interruption criterion includes a number of stored measured values or a number of clusters to which a predetermined number of measured values was assigned in each case. The second interruption criterion is a predetermined position of the stop counter. If none of the interruption criteria has been reached, the method continues with step 315.

In the event that an interruption criterion is reached, the offset of the stored measured values in relation to ideal measured values is determined in a step 340 (see FIG. 2). To that end, the geometric body of a sphere is determined using the method of least squares, the stored points lying in as good an approximation as possible on the sphere's surface. The offset of the center point of this determined sphere from the origin of the measuring axes is the sought offset of the measured values.

After that, the sensitivity of magnetic field sensor 110 along a first axis is determined in a step 345. In one specific embodiment, the sensitivity along this axis may already be known due to correspondingly low manufacturing tolerances of magnetic field sensor 110. In another specific embodiment, current is applied to coil 130 so that a known magnetic field is generated along the z measuring axis. The sensitivity of magnetic field sensor 110 along the z axis may be determined from a measured value in the z direction and the amount of the generated magnetic field. Preferably, the generated magnetic field is great enough, for example, 5 or 10 times greater, that an additional influence of the earth's magnetic field is of no significance in the determination.

Based on the variables determined in steps 340 and 345, a Newton iteration method is performed in a step 350. After that, a check is performed in a step 355 to determine whether the precision achieved by the performing of step 350 is below a predetermined degree. If this is not the case, method 300 continues with step 350 and iterates again using the Newton method.

If it is determined in step 355 that the precision is adequate, the determined calibration parameters are output in a step 360. These calibration parameters normally include three elements of the offset of the measured values along the measuring axes and two elements of the sensitivities along the measuring axes which were not exposed to the magnetic field of coil 130. The determined precision along the z axis may also be output. Based on these parameters, it is possible to correct a recorded measured value so that it lies on the surface of the ideal sphere around the origin of the measuring axes corresponding to measured values 220 in FIG. 2. This correction may also be performed and the corrected measured value may be output in step 260.

Furthermore, the method parameters that were most recently set in step 305 may be adjusted to the determined calibration parameters in an optional step 365. In this way, in particular, the clusters along the measuring axes may be advantageously defined in such a way that recorded measured values are able to be easily assigned to clusters, and neither too many nor too few clusters are defined along the measuring axes.

A mathematical description of key elements of method 300 follows.

To determine correction factor Sz for the sensitivity of magnetic field sensor 110 along the z measuring axis, coil 130 is used to apply a known magnetic field in the z direction to magnetic field sensor 110. Correction factor Sz then results as:

$$S_z = \frac{(\bar{z}(\text{on}) - \bar{z}(\text{off}))}{|B|} \quad \text{(Equation 1)}$$

where:
Sz:=correction factor for calibrating along the z measuring axis
$\bar{z}$(on):=mean value of the measured values in the z direction with the magnetic field activated
$\bar{z}$(off):=mean value of the measured values in the z direction with the magnetic field deactivated
|B|:=applied magnetic field The non-linearities of magnetic field sensor 110 after the sensitivity correction along the z axis may be described as follows:

$$d_i = \sqrt{(Sx_0 \cdot x_i - x_0)^2 + (Sy_0 \cdot y_i - y_0)^2 + (z_i - z_0)^2} \quad \text{(Equation 2)}$$

where:
d:=radius of sphere 220
Sx:=correction factor for calibrating along the x measuring axis
Sy:=correction factor for calibrating along the y measuring axis
$x_0$:=offset of the measured values along the x measuring axis
$y_0$:=offset of the measured values along the y measuring axis
$z_0$:=offset of the measured values along the z measuring axis
i:=index of the measured values The stated sought calibration parameters are ascertained from the stored measured values. A non-linear Newton method is used for this. First, the Jacobian matrix is formed in the known manner:

$$\text{Jacobi} := \begin{pmatrix} \frac{\partial d_1}{\partial Sx} & \frac{\partial d_1}{\partial Sy} & \frac{\partial d_1}{\partial x(\text{off})} & \frac{\partial d_1}{\partial d(\text{off})} & \frac{\partial d_1}{\partial z(\text{off})} \\ \cdots & \cdots & \cdots & \cdots & \cdots \\ \frac{\partial d_1}{\partial Sx} & \frac{\partial d_1}{\partial Sy} & \frac{\partial d_1}{\partial x(\text{off})} & \frac{\partial d_1}{\partial y(\text{off})} & \frac{\partial d_1}{\partial s(\text{off})} \end{pmatrix} \quad \text{(Equation 3)}$$

Distance vector D is determined as:

$$D = d_o - d_i, \quad \text{(Equation 4)}$$

$d_o$ being a first assumption and $d_i$ being determined according to Equation 2.

An equation system is set up in the following form:

$$[(\text{Jacobi})^T \cdot (\text{Jacobi})] \cdot \Delta = (\text{Jacobi})^T \cdot D \quad \text{(Equation 5)}$$

In this connection, $\Delta$ is the vector of the differences between optimal and existing system parameters:

$$\Delta = \begin{pmatrix} \Delta Sx \\ \Delta Sy \\ \Delta Xoff \\ \Delta Yoff \\ \Delta Zoff \end{pmatrix} \quad \text{(Equation 6)}$$

where $\Delta Xoff$ is the offset of the measured values in the x direction,
$\Delta Yoff$ is the offset of the measured values in the y direction and
$\Delta Zoff$ is the offset of the measured values in the z direction.

After the equation system from Equation 5 is solved, the determined deviations are added to the sensor parameters:

$$Sx_i = Sx_{i-1} + \Delta S_x$$

$$Sy_i = Sy_{i-1} + \Delta S_y$$

$$x_i = x_{i-1} + \Delta Xoff$$

$$y_i = y_{i-1} + \Delta Yoff$$

$$z_i = z_{i-1} + \Delta Zoff \quad \text{(Equation 7)}$$

After that, the processing according to Equations 4 through 6 is repeated. The iteration is interrupted if all elements of vector $\Delta$ are below predetermined amounts, so that repeated processing would not result in a relevant improvement of the determined parameters. Parameters Sx, Sy most recently determined using Equation 7 are the sought correction factors for the sensitivities along the measuring axes and parameters x and y indicate the sought superposition along the measuring axes. Sensitivity Sz of the z axis is ascertained in the first step (superposed signal by coil). These six parameters together form the sought calibration parameters.

What is claimed is:
1. A method for calibrating a triaxial magnetic field sensor, comprising:
   determining, with a processor, an offset of recorded measured values of the magnetic field sensor using a superposed signal; and
   determining, with the processor, a sensitivity of the magnetic field sensor along measuring axes;
   wherein the determination of the sensitivity includes determining the sensitivity of the magnetic field sensor along a first measuring axis, and determining the sensitivity of the magnetic field sensor along the other measuring axes based on the sensitivity along the first measuring axis and the determined offset, and
   wherein the sensitivity along the other measuring axes is determined using a Newton iteration method.
2. The method according to claim 1, wherein the sensitivity along the first measuring axis is determined by application of a known magnetic field to the magnetic field sensor.

3. The method according to claim 1, further comprising:
storing recorded measured values which maintain a predetermined minimum distance from all previously stored measured values.

4. The method according to claim 1, wherein the method is continued after a first pass using additional recorded measured values in order to continuously improve the calibration.

5. The method according to claim 1, wherein at least one process parameter is adjusted based on a result of the method.

6. The method according to claim 1, further comprising:
correcting recorded measured values corresponding to the determined sensitivities and the offset.

7. The method according to claim 1, further comprising:
storing recorded measured values which maintain a predetermined minimum distance from all previously stored measured values; and
determining the sensitivity along the first measuring axis by applying a known magnetic field to the magnetic field sensor.

8. The method according to claim 7, wherein the storing and determining is continued after a first pass using additional recorded measured values to continuously improve the calibration.

9. The method according to claim 8, further comprising:
correcting recorded measured values corresponding to the determined sensitivities and the offset.

10. The method according to claim 9, wherein at least one process parameter is adjusted based on a result of the method.

11. The method according to claim 7, further comprising:
correcting recorded measured values corresponding to the determined sensitivities and the offset.

12. The method according to claim 11, wherein at least one process parameter is adjusted based on a result of the method.

13. A non-transitory computer-readable medium having a computer program, which is executable by a processor, comprising:
a program code arrangement having program code for calibrating a triaxial magnetic field sensor, by performing the following:
determining an offset of recorded measured values of the magnetic field sensor using a superposed signal; and
determining a sensitivity of the magnetic field sensor along measuring axes, wherein the determination of the sensitivity includes determining the sensitivity of the magnetic field sensor along a first measuring axis, and determining the sensitivity of the magnetic field sensor along the other measuring axes based on the sensitivity along the first measuring axis and the determined offset, wherein the sensitivity along the other measuring axes is determined using a Newton iteration method.

14. A device for calibrating a triaxial magnetic field sensor, comprising:
a processor for performing the following:
determining an offset of measured values of the magnetic field sensor using a superposed signal;
determining a sensitivity of the magnetic field sensor along a first measuring axis; and
determining a sensitivity of the magnetic field sensor along other measuring axes based on the sensitivity along the first measuring axis and the determined offset, wherein the sensitivity along the other measuring axes is determined using a Newton iteration method.

15. The device according to claim 14, further comprising:
a unit for applying a known magnetic field to the magnetic field sensor along the first measuring axis.

* * * * *